United States Patent [19]
Washida et al.

[11] Patent Number: 5,877,548
[45] Date of Patent: Mar. 2, 1999

[54] TERMINAL CONFIGURATION IN SEMICONDUCTOR IC DEVICE

[75] Inventors: Tetsuro Washida; Katsunori Ochi, both of Tokyo, Japan

[73] Assignee: Mitsubishi Denki Kabushiki Kaisha, Tokyo, Japan

[21] Appl. No.: 762,005

[22] Filed: Dec. 11, 1996

[30] Foreign Application Priority Data

Jun. 24, 1996 [JP] Japan ................................. 8-163004

[51] Int. Cl.⁶ ............................ H01L 23/48; H01L 23/52
[52] U.S. Cl. ..................... 257/690; 257/666; 257/667; 257/692; 257/693
[58] Field of Search ..................................... 257/666, 667, 257/669, 670, 671, 672, 693, 692

[56] References Cited

U.S. PATENT DOCUMENTS 4,928,162  5/1990  Lesk et al. ........................... 257/693
5,057,805  10/1991  Kadowki ............................. 257/666

*Primary Examiner*—Carl Whitehead, Jr.

[57] ABSTRACT

A semiconductor integrated circuit device includes a semiconductor integrated circuit chip, a IC package enclosing the semiconductor integrated circuit chip, lead terminals, and dummy terminals. The lead terminals are partly embedded in the IC package side by side along its opposed sides, and the dummy terminals are partly embedded in the IC package at both ends of a line of the lead terminals. These terminals are electrically connected with the circuit formed in the chip. One end of each terminal protrudes from either of the opposed sides of the IC package and has a connection to be connected with terminal electrodes of a packaging substrate. The dummy terminals are made wider and/or longer than the lead terminals so as to make their connections larger than those of the lead terminals, thereby enhancing their reliability in point of machine-resistance and heat-resistance.

11 Claims, 8 Drawing Sheets

Drop test

Normal bend

Reverse bend

TERMINAL CONFIGURATION IN SEMICONDUCTOR IC DEVICE

BACKGROUND OF THE INVENTION 1. (Field of the Invention)

The present invention relates to a semiconductor integrated circuit device of a surface-mount type which is mounted on one surface of a printed circuit board.

2. (Description of the Prior Art)

In the field of semiconductor integrated circuit devices for use in portable terminal equipment such as portable computers and portable phones, there has been a growing demand for miniaturization. To meet this demand, semiconductor integrated circuit devices make use of a flat package for surface mounting, having narrow lead terminals spaced at a small pitch. Since this design causes the connection between the lead terminals and the electrodes on a substrate such as, for example, a printed circuit board, to be small, the soldering tends to be defective. On the contrary, it has become necessary to further improve the reliability of the connection in point of machine-resistance and heat-resistance because portable terminal equipment is often used outdoors under severe conditions.

Generally, a semiconductor integrated circuit device is composed of a semiconductor integrated circuit chip, a resin-molded package or a ceramic package in which the chip is sealed, and a circuit formed in the chip and adapted to be electrically connected with the lead terminals which are partly embedded in the package. The lead terminals are usually placed side by side along two sides or four sides of the package, thereby connecting the circuit formed in the chip and an external circuit. Those packages where lead terminals are disposed along two sides thereof are called SOP (Small Out-line Package) and those where lead terminals are disposed along four sides thereof are called QFP. (Quad Flat package).

FIG. 15 is a plane view of a conventional SOP type semiconductor integrated circuit device. This device includes a package 2, a semiconductor integrated circuit chip (not shown) completely enclosed in the package 2, and lead terminals 3. The lead terminals 3 are uniform in width and protrude an equal distance from each of the two opposed sides of the package 2.

However, this conventional semiconductor integrated circuit device has a drawback in that the strength of the solder connection between the lead terminals 3 and the electrodes of the packaging substrate is insufficient and lacks reliability. For example, when a reliability test was conducted by mounting the conventional semiconductor integrated circuit device on the printed circuit board, and applying mechanical and thermal stress to the apparatus, the solder connection cracked to become defective. The incidence of the defective tends to increase as the lead terminals are made narrower, which has been a problem in downsizing semiconductor integrated circuit devices.

SUMMARY OF THE INVENTION

In view of the foregoing problem, the object of the present invention is to provide a semiconductor integrated circuit device which is effective to provide highly reliable solder connections in point of machine-resistance and heat-resistance between the lead terminals and the electrodes of the packaging substrate.

In order to achieve the object, the semiconductor integrated circuit device according to one preferred embodiment of the present invention includes a semiconductor chip including a circuit having one or more transistors; a package enclosing the semiconductor chip; a plurality of lead terminals which are partly embedded in the package side by side along at least two sides of the package and electrically connected with the circuit, one end of each lead terminal protruding from the two sides and having a connection to be connected with terminal electrodes of a packaging substrate, the connection having a predetermined length from the end of each lead terminal; and a plurality of dummy terminals which are made wider and/or longer than the plurality of lead terminals and partly embedded in the package at both sides of a line of the plurality of lead terminals, one end of each dummy terminal protruding from the two sides and having a connection to be connected with the terminal electrodes of the packaging substrate, the connection having the predetermined length from the end of each dummy terminal.

Thus, the dummy terminals which have large connections are placed at both ends where the largest stress is applied, and the connections fixedly connect the dummy terminals with the electrodes of the packaging substrate.

Consequently, the strength of the stress to be applied to the lead terminals are mitigated.

According to another preferred embodiment of the present invention, the semiconductor integrated circuit device includes a semiconductor chip including a circuit having one or more transistors; a package enclosing the semiconductor chip; and a plurality of lead terminals which are partly embedded in the package side by side along at least two sides of the package and electrically connected with the circuit, one end of each lead terminal protruding from the two sides and having a connection to be connected with terminal electrodes of a packaging substrate, the connection having a predetermined length from the end of each lead terminal, the plurality of lead terminals being made wider and/or longer as being placed away from the center of the package in order to enlarge an area of each connection.

Thus, the lead terminals are made wider and/or longer as they are placed away from the center of the package so that lead terminals that are subjected to larger stress can have larger connections, thereby increasing the soldering strength. Therefore, it is preferable that the width of each lead terminal is adjusted to the quantity of stress which may act thereon.

According to a further preferred embodiment of the present invention, the semiconductor integrated circuit device includes a semiconductor chip which includes a circuit having one or more transistors; a package enclosing the semiconductor chip; and a plurality of lead terminals which are partly embedded in the package side by side along at least two sides of the package and electrically connected with the circuit, one end of each lead terminal protruding from the two sides and having a connection to be connected with terminal electrodes of a packaging substrate, the connection having a predetermined length from the end of each lead terminal, the plurality of lead terminals being made longer as being placed away from the center of the package in order to enlarge an area of each connection.

Thus, the lead terminals are made longer as they are placed away from the center of the package so that lead terminals that are subjected to larger stress can have larger connections to increase the soldering strength. Therefore, it is preferable that the length of each lead terminal is adjusted to the quantity of stress which may act thereon.

According to a still further preferred embodiment of the present invention, the semiconductor integrated circuit device includes a semiconductor chip which includes a circuit having one or more transistors; a package enclosing the semiconductor chip; and a plurality of lead terminals which are partly embedded in the package side by side along at least two sides of the package and electrically connected with the circuit, one end of each lead terminal protruding from the two sides and having a connection to be connected with terminal electrodes of a packaging substrate, the connection having a predetermined length from the end of each lead terminal, the plurality of lead terminals being made wider and/or longer and longer as being placed away from the center of the package in order to enlarge an area of each connection.

Thus, the lead terminals are made wider and/or longer and longer as they are placed away from the center of the package so that lead terminals that are subjected to larger stress can have larger connections to increase the soldering strength.

According to a yet further preferred embodiment of the present invention, the semiconductor integrated circuit device includes a semiconductor chip which includes a circuit having one or more transistors; a package enclosing the semiconductor chip; and a plurality of lead terminals which are partly embedded in the package side by side along at least two sides of the package and electrically connected with the circuit, one end of each lead terminal protruding from the two sides and having a connection to be connected with terminal electrodes of a packaging substrate, the connection having a predetermined length from the end of each lead terminal, lead terminals that are placed at both ends of a line of the plurality of lead terminals and do not face a side of the semiconductor integrated circuit chip being made wider and/or longer than remaining lead terminals that face the side of the semiconductor integrated circuit chip, thereby enlarging areas of connections of the lead terminals that are placed at both ends of the line.

Thus, lead terminals that are placed at both ends and do not face a side of the semiconductor integrated circuit chip are made wider and/or longer than the other lead terminals that face a side of the chip, so that the connections of the lead terminals at both ends where large stress is applied are made larger to increase the soldering strength.

According to one more preferred embodiment of the present invention, the semiconductor integrated circuit device includes a semiconductor chip which includes a circuit having one or more transistors; a package enclosing the semiconductor chip; and a plurality of lead terminals which are partly embedded in the package side by side along at least two sides of the package and electrically connected with the circuit, one end of each lead terminal protruding from the two sides and having a connection to be connected with terminal electrodes of a packaging substrate, the connection having a predetermined length from the end of each lead terminal, the plurality of lead terminals being placed exclusively in an area of the two sides of the package, the area facing a side of the semiconductor integrated circuit chip.

Thus, the lead terminals are placed only in the area where they face a side of the semiconductor integrated circuit chip, and comparatively small stress is applied.

BRIEF DESCRIPTION OF THE DRAWINGS

This and other objects and features of the present invention will become clear from the following description taken in conjunction with preferred embodiments thereof with reference to the accompanying drawings, in which like parts are designated by like reference numerals and in which.

DETAILED DESCRIPTION OF THE EMBODIMENTS

Figure 1:
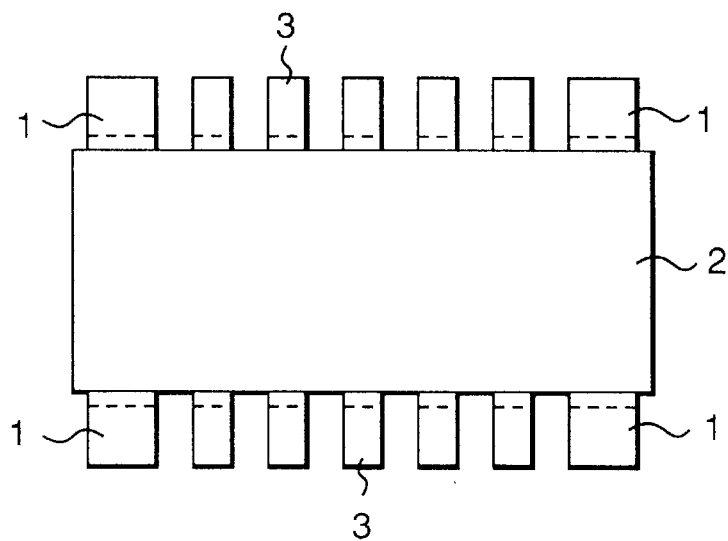
FIG. 1 is a top plane view of the semiconductor integrated circuit device according to a first embodiment of the present invention.

<First Embodiment—FIG. 1>

Referring to FIG. 1, a semiconductor integrated circuit device according to a first preferred embodiment of the present invention comprises a generally rectangular box-like IC package 2 encasing therein one or more semiconductor integrated circuit chips (not shown) and having at least first and second side faces opposite to each other, a plurality of parallel lead terminals 3 embedded at one ends thereof in the IC package 2 and extending outwardly from each of the first and second side faces of the IC package 2, and two dummy terminals 1 positioned on opposite sides of the plural lead terminals 3 and extending outwardly from each of the first and second side faces of the IC package 2.

The lead and dummy terminals 3 and 1 extending outwardly from the first side face of the IC package 2 and the lead and dummy terminals 3 and 1 extending outwardly from the second side faces of the IC package 2 are aligned with each other and are so bent at two locations, shown by the phantom lines, that the semiconductor integrated device itself, when viewed in a direction along the longitudinal axis thereof, can represent a generally gull-wing shape. More specifically, each of the lead and dummy terminals 3 and 1 in each of the first and second side faces of the IC package 2, has one end embedded in the IC package 2 and the opposite free end lying in a plane generally flush with or a slight distance below the plane of bottom of the IC package 2, a generally intermediate portion of which extends downwardly in a direction substantially perpendicular to any one of the opposite ends thereof.

The semiconductor integrated circuit device embodying the present invention is of a surface-mount type in which some or all of the free ends of the lead and dummy terminals 3 and 1 in each side face of the IC package 2 rest on and soldered to respective electrodes on the surface of the printed circuit board. Accordingly, the free end of each terminal 3 and 1 in each side face of the IC package 2, which lies substantially parallel to the bottom of the IC package 2, is utilized for electromechanical connection with an associated electrode on a surface of a printed circuit board (not shown) by the use of any known soldering technique. It is, however, to be noted that all of the dummy terminals 1, though their free ends are soldered to the associated electrodes on the printed circuit board, are not electrically connected with and are, therefore, isolated from the semiconductor integrated circuit chips encased in the IC package 2.

In this embodiment, all of the lead terminals 3 are made of metal suitable for soldering such as, for example, a Fe-Ni alloy or copper, and are electrically connected with a circuit including one or more transistors integrated in the semiconductor integrated circuit chip. On the other hand, the dummy terminals 1 may be made of the same metal as the lead terminals 3, but are not connected with any circuit integrated in the semiconductor integrated circuit chip.

In the semiconductor integrated circuit device of the above described construction, both the dummy terminals 1 and the lead terminals 3 are soldered to the terminal electrodes on the printed circuit board on which it has been placed. Accordingly, stresses which would be built up at respective solder connections between the free ends of the lead terminals 3 and the corresponding electrodes on the printed circuit board as a result of application of impacts and/or thermal change by the reason which will be described latter can advantageously be lessened, accompanied by increase in reliability in resistance to physical shocks and also to heat.

In the practice of the foregoing embodiment of the present invention, the free end of each of the dummy terminals 1 in each side face of the IC package 2, which is soldered to the corresponding electrode on the printed circuit board, is preferred to provide a relatively large surface area to secure a highly reliable solder connection. For this reason, each of the dummy terminals 1 in each side face of the IC package 2 preferably has a width greater than that of any one of the lead terminals 3 in each side face of the IC package 2.

Figure 2:
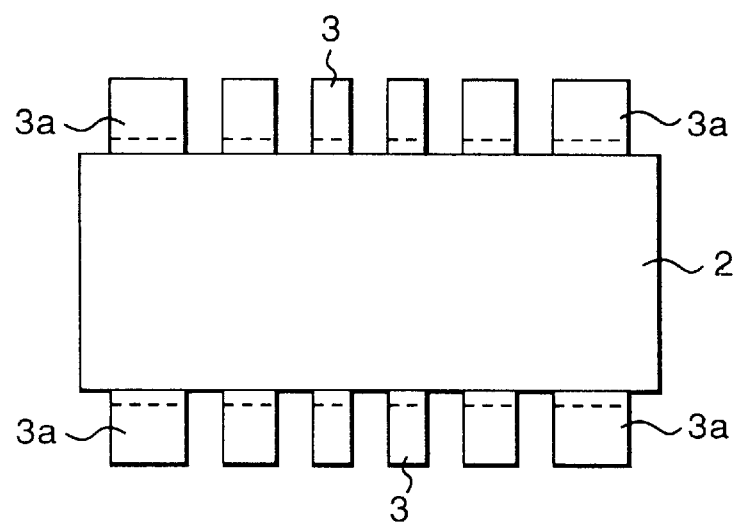
FIG. 2 is a top plane view of the semiconductor integrated circuit device according to a second embodiment of the present invention.

<Second Embodiment—FIG. 2>

In the foregoing embodiment shown in FIG. 1, the dummy terminals 1 have been described as employed on respective sides of the plural lead terminals 3 in each side face of the IC package 1. However, in this embodiment shown in FIG. 2, no dummy terminal is employed and, instead, the opposite outermost ones of the lead terminals, indicated by 3a, in each side face of the IC package 2 is so tailored as to have a width greater than the width of any one of the remaining lead terminals 3.

According to this embodiment, since portions of the lead terminals which are susceptible to a relatively high stress tending to build up by the effect of impacts and/or thermal change have a relatively large surface area for solder connection, an increased connecting strength can be obtained at such portions of the lead terminals where the high stress set-up occurs, thus making it possible to increase the reliability in solder connection.

Figure 3:
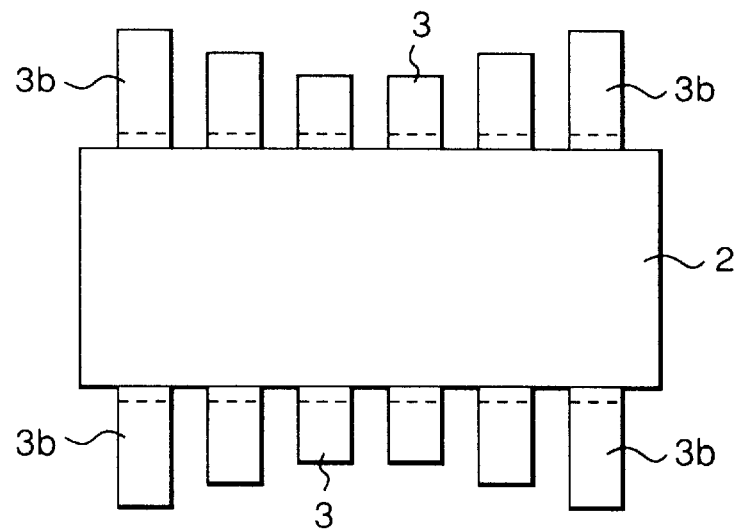
FIG. 3 is a top plane view of the semiconductor integrated circuit device according to a third embodiment of the present invention.

<Third Embodiment—FIG. 3>

The semiconductor integrated circuit device according to the third embodiment of the present invention shown in FIG. 3 is similar in construction to that shown in any one of FIG. 2 except that the opposite outermost lead terminals, indicated by 3a, in each side face of the IC package 2 have a width equal to that any one of the remaining lead terminals 3 and that the lead terminals 3 and 3a in each side face of the IC package 2 have a varying length. Specifically, the opposite outermost lead terminals 3b in each side face of the IC package 2 are of an equal length and have a maximum required length and the length of the remaining lead terminals 3 in each side face of the IC package 2 progressively decreases towards one or two lead terminals positioned intermediate between the opposite outermost lead terminals 3a.

According to this embodiment, since portions of the lead terminals which are susceptible to a relatively high stress tending to build up by the effect of impacts and/or thermal change have a relatively large surface area for solder connection, an increased connecting strength can be obtained at such portions of the lead terminals where the high stress set-up occurs, thus making it possible to increase the reliability in solder connection.

Figure 4:
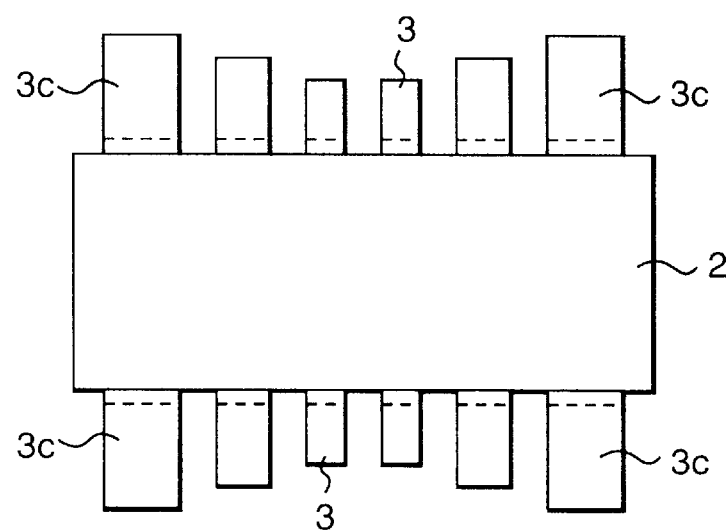
FIG. 4 is a top plane view of the semiconductor integrated circuit device according to a fourth embodiment of the present invention.

<Fourth Embodiment—FIG. 4>

The semiconductor integrated circuit device according to the fourth embodiment of the present invention shown in FIG. 4 is similar in construction to that shown in FIG. 3, except that the opposite outermost lead terminals, now indicated by 3c, have a width greater than any one of the remaining lead terminals 3 in each side face of the IC package 2. Thus, it is clear that, as compared with the opposite outermost lead terminals 3b in the semiconductor integrated circuit device shown in FIG. 3, the opposite outermost lead terminals 3c in each side face of the IC package 2 shown in FIG. 4 has both the greatest length and the greatest width of all the lead terminals.

According to this embodiment, since portions of the lead terminals which are susceptible to a relatively high stress tending to build up by the effect of impacts and/or thermal change have a relatively large surface area for solder connection, an increased connecting strength can be obtained at such portions of the lead terminals where the high stress set-up occurs, thus making it possible to increase the reliability in solder connection.

Figure 5:
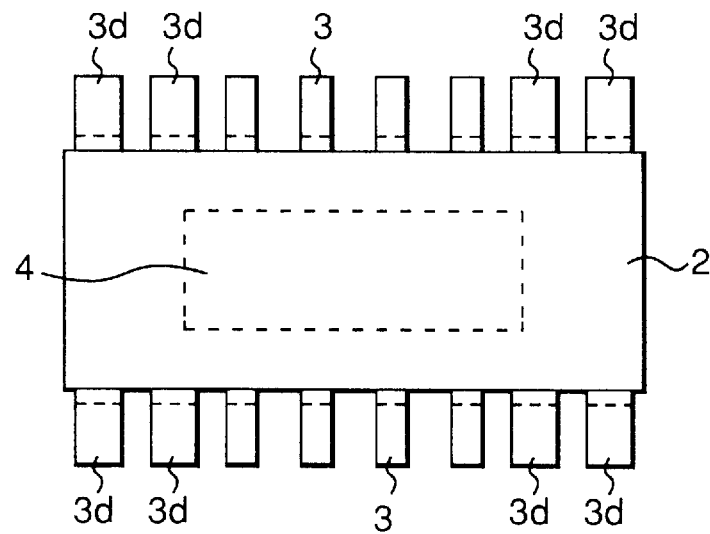
FIG. 5 is a top plane view of the semiconductor integrated circuit device according to a fifth embodiment of the present invention.

<Fifth Embodiment—FIG. 5>

Referring now to FIG. 5, the semiconductor integrated circuit chip is shown by the phantom line 4 as embedded in the IC package 2. The semiconductor IC chip 4 is of a generally rectangular configuration with its longitudinal axis substantially aligned with that of the package 2, but has a length smaller than that of the package 2. As is the case with any one of the foregoing embodiments of the present invention shown respectively in FIGS. 2 to 4, the package 2 has the lead terminals protruding laterally outwardly from each of the first and second side faces thereof.

According to the fifth embodiment of the present invention, some of the lead terminals encompassed completely within an area delimited by the length of the semiconductor IC chip 4, that is, the lead terminals 3, have an equal width whereas some of the lead terminals positioned outside such area delimited by the length of the semiconductor IC chip 4, that is, the outer lead terminals indicated by 3d, have an equal width, but greater than the width of any one of the lead terminals 3 positioned intermediate between those outer lead terminals 3d.

The inventors of the present invention have conducted a simulated test to determine the IC mount strength. During the simulated test, the duration over which the semiconductor integrated circuit device can be firmly mounted on the printed circuit board was measured by estimating the quantity of stresses acting on the lead terminals as a result of application of mechanical shocks and/or thermal change. The fifth embodiment of the present invention is based on the finding obtained from the simulated test that the quantity of stresses imposed on the lead terminals 3 formed in each of the first and second side faces of the package 2 and encompassed within the area delimited by the length of the semiconductor IC chip 4 is smaller than that on the outer lead terminals 3d formed in each of the first and second side faces of the package 2 and positioned outside the area delimited by the length of the semiconductor IC chip 4. Accordingly, to increase the area of solder connection to thereby secure a highly reliable solder connection between the free ends of the lead terminals and the corresponding electrodes on the printed circuit board, the outer lead terminals 3d are so tailored as to have a greater width than that of any one of the remaining lead terminals 3.

Figure 6:
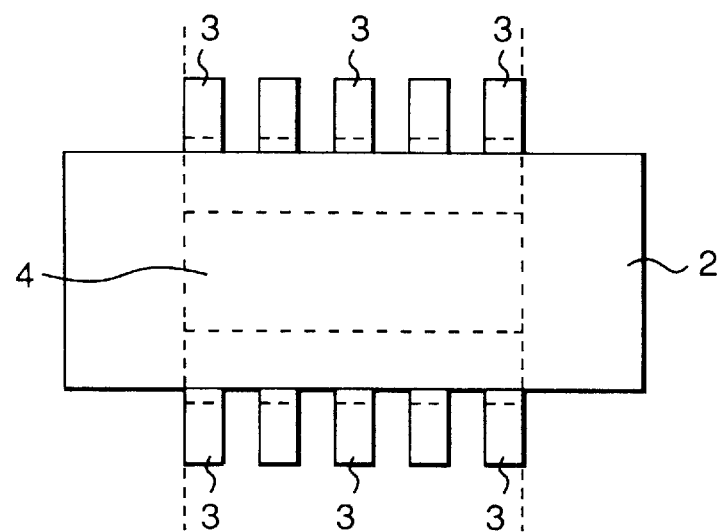
FIG. 6 is a top plane view of the semiconductor integrated circuit device according to a sixth embodiment of the present invention.

<Sixth Embodiment—FIG. 6>

The semiconductor integrated circuit device shown in FIG. 6 is substantially similar to that shown in FIG. 5, except that the lead terminals 3 are formed in a portion of each of the first and second side faces of the IC package 2 encompassed within the area delimited by the length of the semiconductor IC chip 4. Even this sixth embodiment of the present invention can bring about an effect substantially similar to that afforded by the semiconductor integrated circuit device according to the fifth embodiment shown in and described with reference to FIG. 5.

The semiconductor integrated circuit device according to any one of the foregoing embodiments of the present invention has been shown and described as a SOP (Small Out-line Package) characterized in that a plurality of terminal elements extend outwardly from each of the opposite side faces of the package. However, the concept of the present invention can be equally applied to any other surface-mount type such as, for example, QFP (Quad Flat Package) in which a plurality of terminal elements extend outwardly from each of four side faces of the package, TSOP (Thin Small Out-line Package) or TQFP (Thin Quad Flat Package).

In addition, each of the lead terminals 3 employed in any one of the foregoing embodiments of the present invention may be either a normal bend structure or a reverse bend structure.

Hereinafter, the present invention will be demonstrated by way of results of simulated tests conducted to determine the maximum stress which would act on the solder connection between each terminal of the semiconductor integrated circuit device and the corresponding electrode on the printed circuit board when the semiconductor integrated circuit device mounted on the printed circuit board is subjected to thermal change and impacts. For those simulated tests, the following three device models, Model I, Model II and Model III, were prepared.

Figure 9:
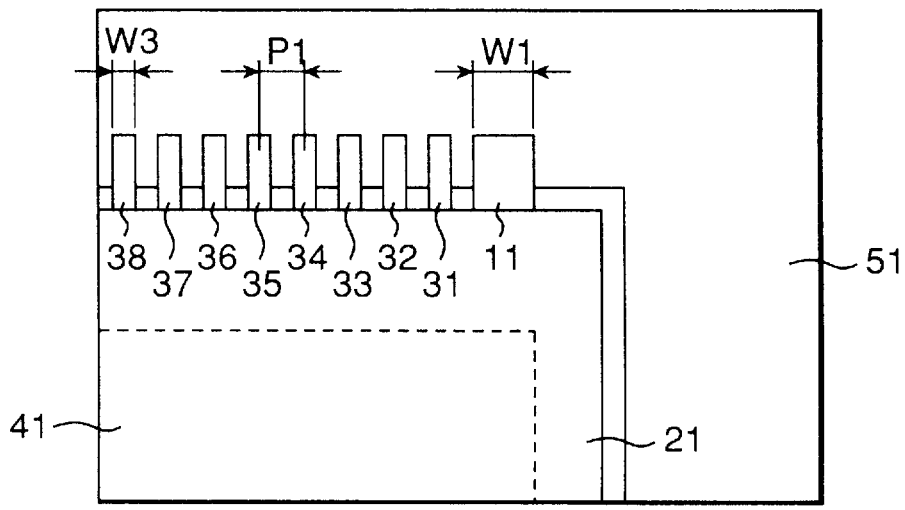
FIG. 9 is a fragmentary top plan view, on an enlarged scale, showing the semiconductor integrated circuit device used as Model I during the simulated test.
Figure 13:
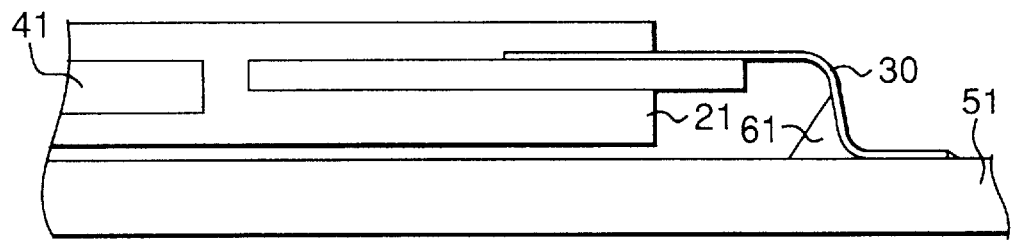
FIG. 13 is a fragmentary side view, showing the normal bend structure of the semiconductor integrated circuit device.

Model I:

Model I was based on the first embodiment of the present invention shown in and described with reference to FIG. 1. Referring to FIG. 9 in which only a quarter corner of the small out-line package 21 is shown as mounted on a corresponding portion of the printed circuit board 51, the package 21 is of a substantially rectangular box-like configuration having the semiconductor IC chip 41 embedded therein. This package 21 has the first and second side faces opposite to each other and lying parallel to the longitudinal axis thereof and also has a plurality of lead terminals extending outwardly from each of the first and second side faces thereof in respective directions opposite to each other, only the lead terminals 31 to 38 in one of the first and second side faces being shown in FIG. 9. The two dummy terminals, only one of which is shown by 11 in FIG. 9, are positioned on respective sides of the plural lead terminals and extend outwardly from each of the first and second side faces of the package 21 in respective directions opposite to each other and parallel to any one of the lead terminals. The total number of the lead terminals intervening between the two dummy terminals 11 in each side face of the package 21 was 16. Other particulars of Model I used during the simulated tests were as follows:

(1) Package Size: 17.5×10 mm
(2) Dummy Terminal Width W1: 1.0 mm
(3) Lead Terminal Width W3: 0.4 mm
(4) Lead Terminal Pitch P1: 0.8 mm
(5) Size of Chip 41: 14.40×5.48 mm
(6) Size of Board 51: 24×16 mm The terminals employed in Model I took such a normal bend structure as shown in FIG. 13 wherein reference numeral 61 represents a solder deposit, reference numeral 30 represents a terminal representative of any one of the lead and dummy terminals shown in FIG. 9. In Model I, the semiconductor IC chip 41, rectangular in shape, extends a length with each of its opposite ends aligned generally with the imaginary line drawn to extend intermediate of the width of the corresponding dummy terminal 11 in a direction perpendicular to the lengthwise direction of the semiconductor IC chip 41.

Figure 10:
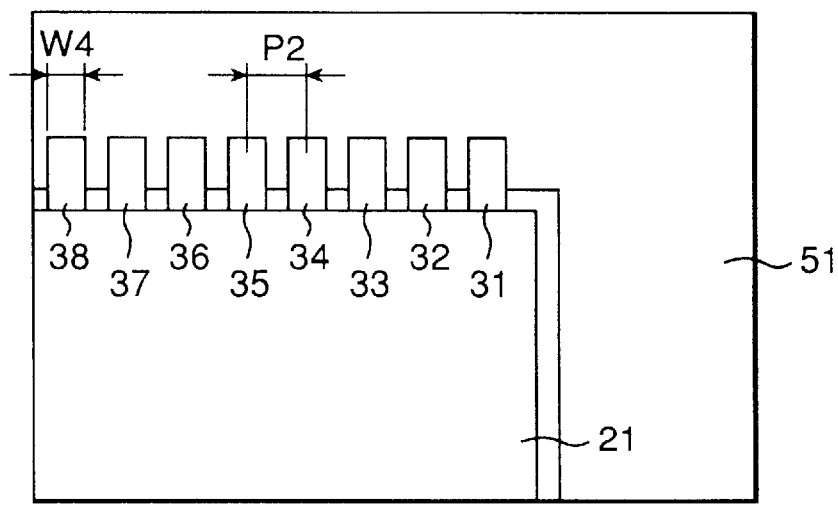
FIG. 10 is a fragmentary top plan view, on an enlarged scale, showing the semiconductor integrated circuit device used as Model II during the simulated test.

Model II:

Model II was prepared only for the purpose of comparison with Model I based on the present invention and was based on the prior art semiconductor integrated circuit device. A correspondingly quarter corner portion of Model II is shown in FIG. 10. As is the case with Model I, the semiconductor integrated circuit device shown in FIG. 10 includes a similar package 21 with 16 lead terminals, only eight of which are shown by 31 to 38, extending outwardly from each of the first and second sides of the package 21, but no dummy terminal is employed. Particulars of the semiconductor integrated circuit device shown in FIG. 10 are identical with those of Model I, except that the lead terminal width W4 and the lead terminal pitch P2 were chosen to be 0.6 mm and 1.0 mm, respectively.

In Model II shown in FIG. 10, the semiconductor IC chip 41, rectangular in shape, extends a length with each of its opposite ends aligned generally with the imaginary line drawn to extend intermediate between the outermost neighboring lead terminals 31 and 32 in a direction perpendicular to the lengthwise direction of the semiconductor IC chip 41. In other words, each outermost lead terminals 31 in each side face of the package 21 is situated outside the area delimited by the length of the semiconductor IC chip 41 whereas the remaining lead terminals, including those identified by 32 to 38, are situated and encompassed within the area delimited by the length of the semiconductor IC chip 41.

Figure 11:
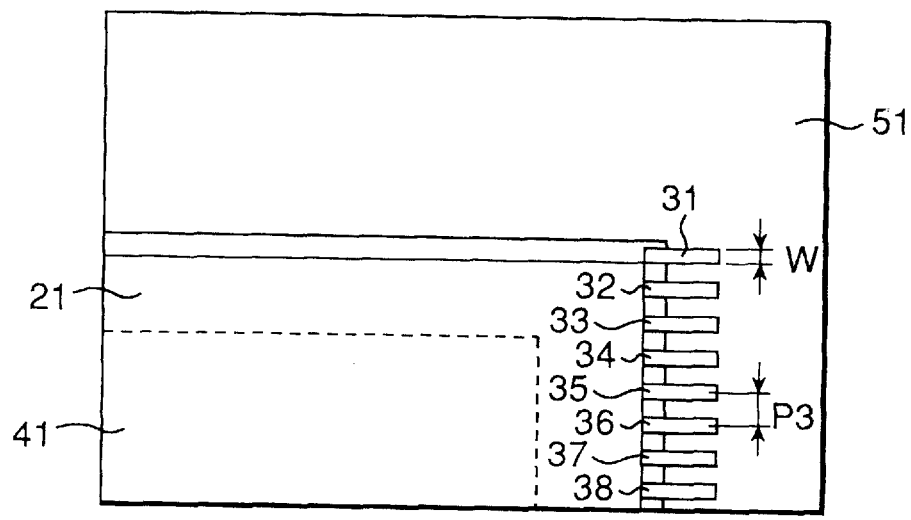
FIG. 11 is a fragmentary top plan view, on an enlarged scale, showing the semiconductor integrated circuit device used as Model III during the simulated test.

Model III:

Model III was prepared only for the purpose of comparison with Model I based on the present invention and a correspondingly quarter corner portion of Model III is shown in FIG. 11. Model III was similar in structure to Model II, except that the 16 lead terminals, only the lead terminals 31 to 38 being shown in FIG. 11, are provided on each of opposite first and second end faces of the package 21.

Particulars of Model III are as follows:
(1) Package Size: 18.4×8.0 mm
(2) Lead Terminal Width W5: 0.2 mm
(3) Lead Terminal Pitch P3: 0.5 mm
(4) Size of Chip 41: 13.90×5.5 mm
(5) Size of Board 51: 24×16 mm The lead terminals employed in Model III took such a normal bend structure as shown in FIG. 13. In Model III the lead terminal 33 in each end face of the package 21 was situated on an extension of the corresponding side face of the package 21 and the lead terminals 31 and 32 in each end face thereof are situated laterally outwardly of the semiconductor IC chip 41.

Figure 7:
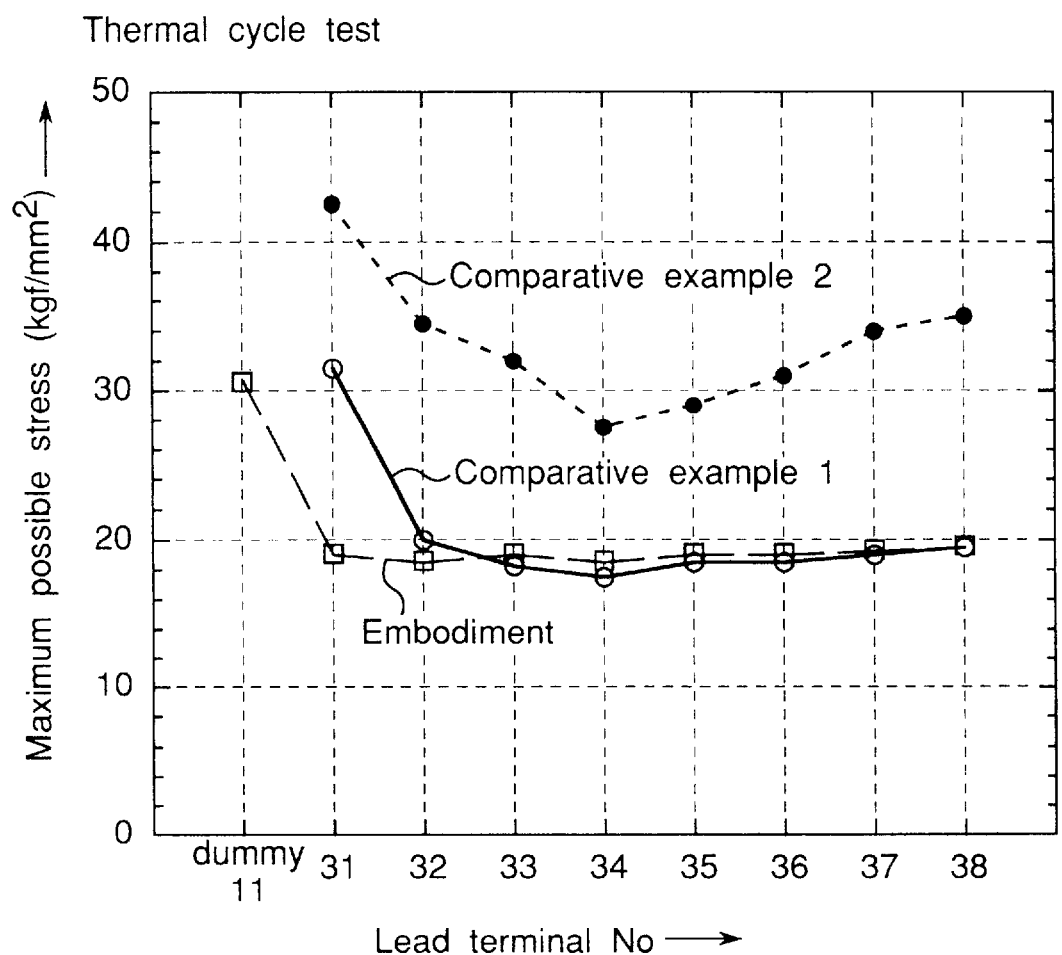
FIG. 7 is a graph showing result of the thermal cycle test conducted in simulation to determine the maximum possible stress which would act on terminals in semiconductor IC devices when the latter are subjected to change in temperature.

Models I to III were subjected to a simulated thermal cycle test to determine the maximum stress which would act on each of the lead terminals 31 to 38 and dummy terminal 11 if they were placed under a condition in which a temperature difference Δt of 165° C. was created ranging from −40° C. to 125° C. Results of the tests are shown in the graph of FIG. 7. As the graph of FIG. 7 makes it clear, in any one of Models I to III, the maximum stress acted on the dummy terminal 11 or the outermost lead terminal 31. In particular, in Model I, only a relatively low stress acted substantially equally on the lead terminals 31 to 38. Accordingly, it will readily be understood that Model I gives rise to a relatively high reliability against thermal change.

Figure 12:
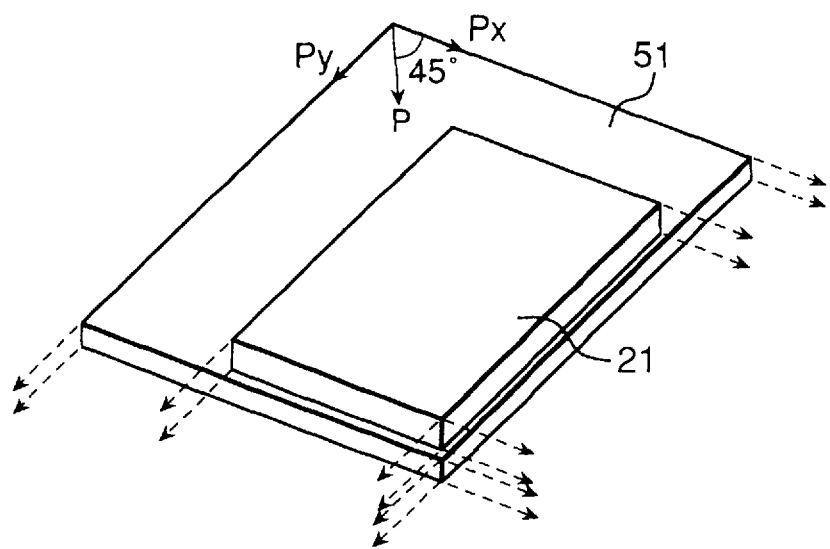
FIG. 12 is a schematic perspective view of a printed circuit board with the semiconductor integrated circuit device mounted thereon, showing the direction of load applied during the drop test of which results are shown in FIG. 8.

Models I to III were also subjected to a simulated drop test to determine the maximum stress which would act on each of the lead terminals 31 to 38 and dummy terminal 11. The simulated drop test were conducted under the assumption that, when the semiconductor integrated circuit device is dropped with one corner of the printed circuit board 51 oriented downwardly to collide with a floor surface, a forced load P of 3,000 G would act on the printed circuit board 51 in a direction inclined 45° relative to any one of the long and short sides delimiting such corner of the printed circuit board 51 as shown in FIG. 12. Results of the simulated drop test are shown in the graph of FIG. 8.

Figure 8:
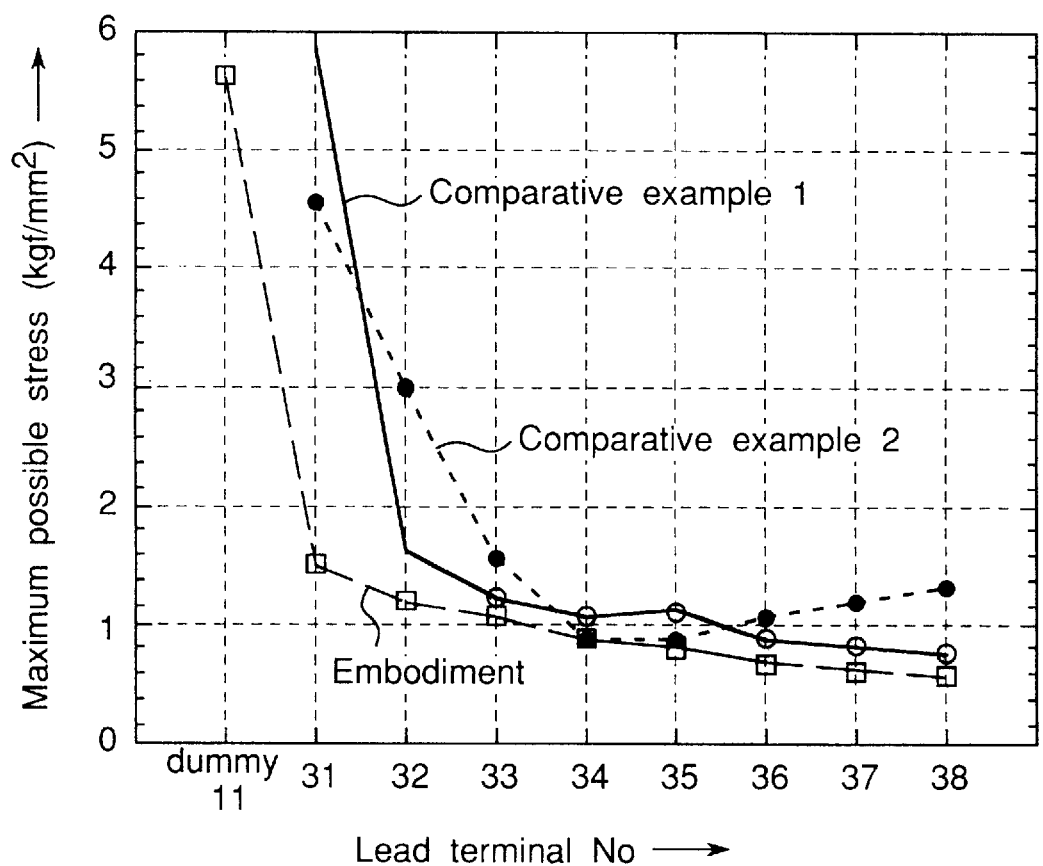
FIG. 8 is a graph showing result of the drop test conducted in simulation to determine the maximum possible stress which would act on terminals in semiconductor IC devices when the latter are dropped.

The graph of FIG. 8 makes it clear that in any one of Models I to III, the maximum stress acted on the dummy terminal 11 or the outermost lead terminal 31. In particular, in Model I, only a relatively low stress acted substantially equally on the lead terminals 31 to 38. Accordingly, it will readily be understood that Model I gives rise to a relatively high reliability against shocks or impact applied thereto.

Figure 14:
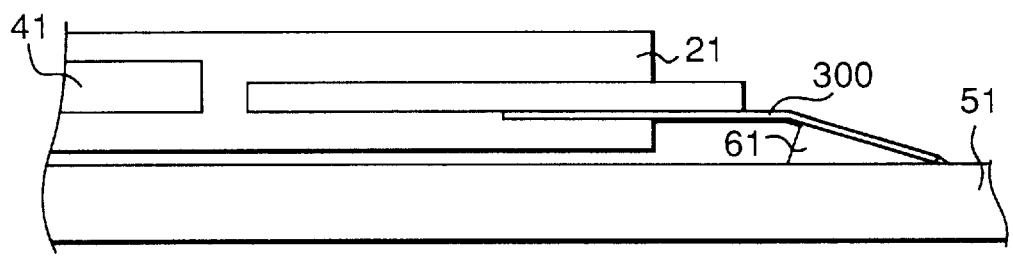
FIG. 14 is a fragmentary side view, showing the reverse bend structure of the semiconductor integrated circuit device.
Figure 15:
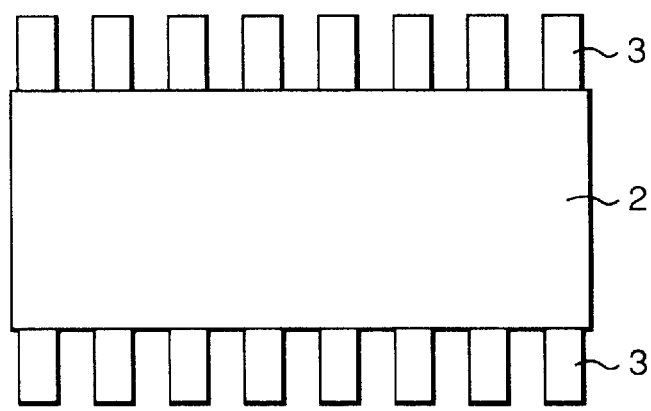
FIG. 15 is a plane view of the conventional semiconductor integrated circuit device.

Test results similar to those shown in FIGS. 7 and 8 can be obtained even though the lead terminals take the reverse bend structure shown in FIG. 14 in which reference numeral 300 represents a lead terminal of the reverse bend structure.

Reviewing the graphs shown respectively in FIGS. 7 and 8, it is clear that the semiconductor integrated circuit device according to the first embodiment of the present invention is effective to provide a relatively high reliability against the thermal change and impact.

Moreover, the simulated test results shown respectively in FIGS. 7 and 8 altogether suggest the following features:

(a) The quantity of the stress acting on the lead terminals due to temperature change or impact depends on the position of the lead terminals. That is, the lead terminals are subjected to larger stress as they are placed away from the center of the IC package 21. Therefore, the semiconductor integrated circuit device according to any one of the second to fourth embodiments where lead terminals have a relatively large area of solder connection as they are placed away from the center have a high reliability against temperature change and impact.

(b) The lead terminals (the lead terminals 31 in Model II and the lead terminals 31 and 32 in Model II), which are placed outside the area where they face the longer sides or the shorter sides of the semiconductor integrated circuit chip 4 are subjected to larger stress due to temperature change and impact. Therefore, the semiconductor integrated circuit device according to the fifth embodiment have a high reliability against temperature change or impact because the outer lead terminals, which do not face a side of the semiconductor integrated circuit chip 4 have an increased width to increase the soldering strength. The semiconductor integrated circuit device according to the sixth embodiment also have a high reliability against temperature change or impact because the lead terminals are placed only in the area where they face a side of the semiconductor integrated circuit chip 4, so that they are subjected to comparatively small stress.

As apparent from the aforementioned description, the semiconductor integrated circuit device of the present invention is effective to provide a solder connection that is highly reliable in point of machine resistance and heat resistance, between each lead terminal and the corresponding electrode on the printed circuit board. This highly reliable connection can be obtained by placing dummy terminals having relatively large connections so that the maximum possible stress may act on the dummy terminals and relatively lower stress may act on each lead terminal.

Also, the highly reliable connections can be obtained by making the lead terminals wider and/or longer as they are placed away from the center of the IC package to make the connections larger, or by adjusting the width of each lead terminal in reference to the quantity of stress which would act thereon.

Moreover, the highly reliable connections can be obtained by making the lead terminals longer as they are placed away from the center of the IC package to make the connections larger, or by adjusting the length of each lead terminal in reference to the quantity of stress which would act thereon.

Furthermore, the highly reliable connections can be obtained by making the outer lead terminals wider and/or longer so that their connections where relatively high stress may act are made larger.

Yet, the highly reliable connection can be obtained by placing the lead terminals only in the area where they confront the adjacent sides of the semiconductor integrated circuit chip and where comparatively low stress may act.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A semiconductor integrated circuit device, comprising:
   an IC package enclosing a semiconductor chip including a circuit having one or more transistors;
   said IC package having a centerpoint located at a center of said IC package;
   a plurality of terminal leads partly embedded in said IC package along at least two sides of said IC package, one end of each terminal lead protruding from a respective one of the sides of said IC package
   said terminal leads including outer terminal leads and inner terminal leads,
   wherein said outer leads are disposed further away from the centerpoint of said IC package than said inner terminal leads,
   said outer terminal leads having a greater surface area than said inner terminal leads,
   wherein the surface areas of said plurality of terminal leads increase in direct relation to a distance from the centerpoint of said IC package.

2. The semiconductor integrated circuit device as claimed in claim 1, wherein said outer terminal leads are dummy terminals and are wider than said inner terminal leads.

3. The semiconductor integrated circuit device as claimed in claim 1, wherein said outer terminal leads are dummy terminals and are longer than said inner terminal leads.

4. The semiconductor integrated circuit device as claimed in claim 1, wherein said outer terminal leads are dummy terminals and are wider and longer than said inner terminals leads.

5. The semiconductor integrated circuit device as claimed in claim 1, wherein said outer terminal leads are lead terminals connected to the circuit and are wider than said inner terminal leads.

6. The semiconductor integrated circuit device as claimed in claim 5, wherein said outer terminal leads are lead terminals connected to the circuit and are longer than said inner terminal leads.

7. The semiconductor integrated circuit device as claimed in claim 1, wherein said outer terminal leads are lead terminals connected to the circuit and are longer and wider than said inner terminal leads.

8. The semiconductor integrated circuit device as claimed in claim 1 said outer terminal leads disposed at outer ends of said IC package,
   wherein the circuit is not disposed within the outer ends of said IC package.

9. The semiconductor integrated circuit device as claimed in claim 8, wherein said outer terminal leads are longer than said inner terminal leads.

10. The semiconductor integrated circuit device as claimed in claim 8, wherein said outer terminal leads are wider than said inner terminal leads.

11. The semiconductor integrated circuit device as claimed in claim 8, wherein said outer terminal leads are wider and longer than said inner terminal leads.

* * * * *